(12) United States Patent
Ito et al.

(10) Patent No.: US 7,466,531 B2
(45) Date of Patent: Dec. 16, 2008

(54) SUBSTRATE HOLDING SYSTEM AND EXPOSURE APPARATUS USING THE SAME

(75) Inventors: Atsushi Ito, Tochigi-ken (JP); Keiji Emoto, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/770,979

(22) Filed: Jun. 29, 2007

(65) Prior Publication Data
US 2007/0247780 A1    Oct. 25, 2007

Related U.S. Application Data

(62) Division of application No. 10/952,732, filed on Sep. 30, 2004, now Pat. No. 7,292,426.

(30) Foreign Application Priority Data
Oct. 1, 2003    (JP)    ............... 2003-343676

(51) Int. Cl.
*H01T 23/001* (2006.01)
(52) U.S. Cl. ....................... 361/234; 361/230
(58) Field of Classification Search .......... 361/230–234
See application file for complete search history.

(56) References Cited

U.S. PATENT DOCUMENTS

| | | | | |
|---|---|---|---|---|
| 4,551,192 A | 11/1985 | Di Milia et al. | ............. | 156/345 |
| 4,969,168 A | 11/1990 | Sakamoto et al. | ............. | 378/34 |
| 5,315,473 A | 5/1994 | Collins et al. | ............... | 361/234 |
| 5,841,624 A | 11/1998 | Xu et al. | ...................... | 361/234 |
| 5,886,863 A | 3/1999 | Nagasaki et al. | ............. | 361/234 |
| 5,923,408 A | 7/1999 | Takabayashi | ................. | 355/53 |
| 6,226,073 B1 | 5/2001 | Emoto | .......................... | 355/53 |
| 6,552,773 B2 | 4/2003 | Emoto | .......................... | 355/53 |
| 6,741,446 B2 | 5/2004 | Ennis | .......................... | 361/234 |
| 6,810,298 B2 | 10/2004 | Emoto | ......................... | 700/121 |
| 6,919,124 B2 * | 7/2005 | Ito | .............................. | 428/210 |
| 7,056,831 B2 * | 6/2006 | Iwai et al. | .................... | 438/715 |
| 2002/0000029 A1 | 1/2002 | Emoto | ......................... | 29/25.01 |
| 2002/0132409 A1 | 9/2002 | Akutsu et al. | ............... | 438/200 |
| 2003/0007136 A1 | 1/2003 | Emoto et al. | ................... | 355/30 |
| 2003/0035088 A1 | 2/2003 | Emoto | .......................... | 355/53 |
| 2004/0080727 A1 | 4/2004 | Emoto | .......................... | 355/30 |

FOREIGN PATENT DOCUMENTS

| | | |
|---|---|---|
| EP | 0 357 424 A2 | 3/1990 |
| EP | 0 693 774 A2 | 1/1996 |
| EP | 1 191 580 A1 | 3/2002 |
| GB | 2 149 697 A | 6/1985 |
| JP | 4-147643 | 5/1992 |

(Continued)

*Primary Examiner*—Danny Nguyen
(74) *Attorney, Agent, or Firm*—Fitzpatrick, Cella, Harper & Scinto

(57) ABSTRACT

A substrate holding system for holding a substrate based on vacuum attraction and electrostatic attraction including a rim configured to support the substrate, a protrusion for the electrostatic attraction, configured to support the substrate inside the rim, and a protrusion for the vacuum attraction, configured to support the substrate inside the rim. A substrate supporting surface area of the protrusion of the electrostatic attraction is larger than a substrate supporting surface area of the protrusion for the vacuum attraction.

7 Claims, 12 Drawing Sheets

FOREIGN PATENT DOCUMENTS

| | | |
|---|---|---|
| JP | 6-47642 | 2/1994 |
| JP | 6-63885 | 3/1994 |
| JP | 6-240325 | 8/1994 |
| JP | 2587227 | 12/1996 |
| JP | 2633516 | 4/1997 |
| JP | 2003-142393 | 5/2003 |
| WO | WO 00/65645 | 2/2000 |

* cited by examiner

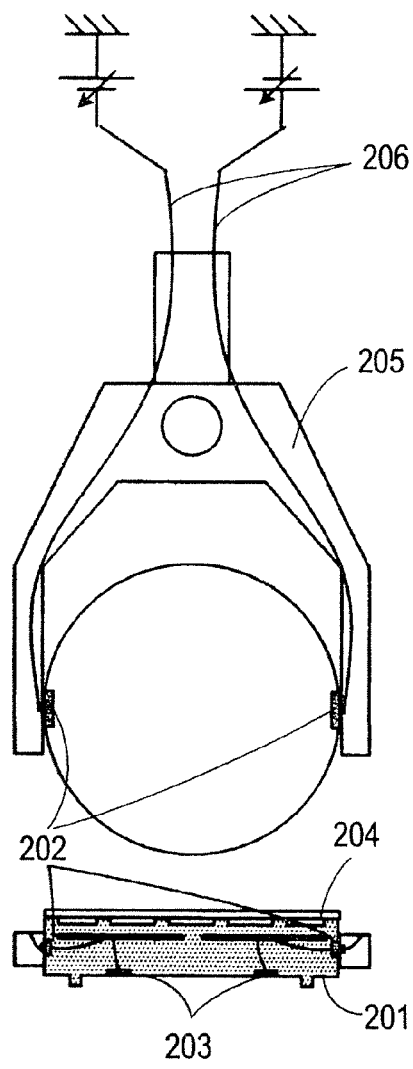
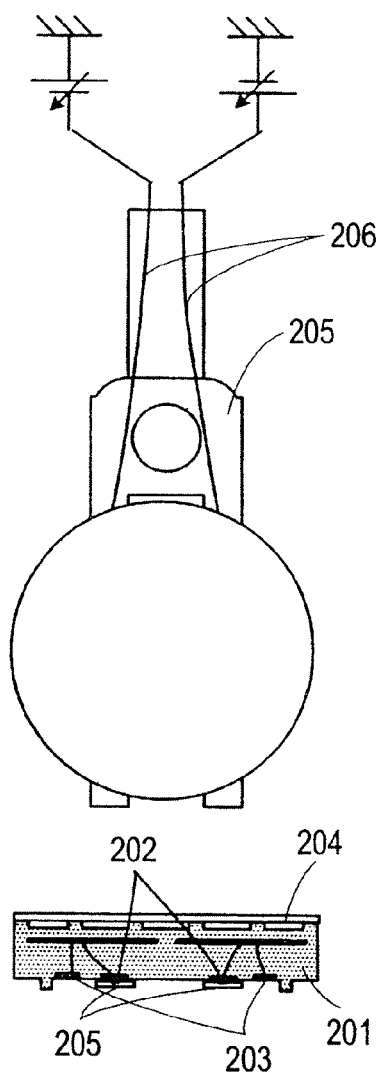
FIG.3A
FIG.3B

SUBSTRATE HOLDING SYSTEM AND EXPOSURE APPARATUS USING THE SAME

This application is a divisional application of copending U.S. patent application Ser. No. 10/952,732, filed Sep. 30, 2004.

FIELD OF THE INVENTION AND RELATED ART

This invention relates to a substrate holding technique suitable for safely and securely holding even a warped substrate. More particularly, the invention concerns a substrate holding technique suitably usable in an apparatus, such as a semiconductor exposure apparatus using extreme ultraviolet (EUV) light or a charged-particle beam, wherein a substrate is processed in a vacuum or a reduced pressure ambience.

The density and fineness of semiconductor devices are advancing much more, and a substrate holding system is required to have a capability of holding a substrate at a higher precision. If the substrate holding precision is insufficient, a printed pattern or an overlay precision is degraded.

Conventionally, a substrate such as a wafer is held in accordance with a mechanical holding method or a vacuum attraction holding method.

The mechanical holding method is a simple method in which only an outside peripheral portion of a wafer is physically clamped. Although it has a feature of being less susceptible to the influence of the environment, since only the outer periphery of the wafer is held, there is a problem of deformation of the wafer or damaging the wafer.

The method based on vacuum attraction is a method in which the bottom face of a wafer is supported by many protrusions and a negative pressure is created in the clearance between the wafer and a substrate attracting device, by which the wafer is attracted. As compared with the mechanical holding method, this method is advantageous in the point of suppressing wafer deformation because the whole wafer surface is attracted. However, this method cannot be used in a vacuum ambience, and it cannot be applied to apparatuses using a vacuum.

On the other hand, there is a method based on an electrostatic force. Since this method uses electrostatic force, it can be used even in a vacuum or a reduced pressure ambience. Thus, actually, it is supplied to various device manufacturing processes such as an etcher, a PVD or a CVD. In regard to exposure apparatuses, particularly, in an electron beam exposure apparatus or an EUV exposure apparatus, the exposure process has to be carried out in a vacuum ambience to avoid attenuation of an electron beam or EUV light. Thus, in such apparatuses, use of a substrate holding system based on electrostatic force is considered to be required.

Substrates such as wafers to be processed in semiconductor manufacturing steps are not always uniform in a plane, and, in some cases, they may have a large warp as a result of a film forming process, for example.

Conventionally, an attraction force can be applied to the whole wafer surface by vacuum attraction such that the warp of the wafer can be corrected thereby. However, as described, this technique cannot be used in a system operated in a vacuum ambience.

On the other hand, electrostatic attraction cannot easily meet such warping of a wafer, as compared with the vacuum attraction. Generally, in a substrate holding system, the contact surface to a wafer is limited so as to prevent degradation of the flatness due to biting of particles. In the electrostatic attraction, basically, the attraction force is produced at the contact surface.

To avoid this problem, Japanese Laid-Open Patent Application, Publication No. 6-204325, proposes an electrostatic attracting device having stripe-like electrodes and means for applying a voltage to each electrode independently. For example, voltages are applied sequentially to these electrodes in an order from a central electrode to a peripheral electrode or from one end electrode to the other end electrode, for example, to ensure that a warped wafer sequentially follows the substrate attracting device. With this method, if a wafer is warped in a parabolic shape, such as an upward convex or a downward convex shape, the flatness correction may be attainable. However, if a wafer is warped irregularly, correction is difficult to achieve.

Furthermore, after the wafer flatness correction, the wafer must be conveyed to a substrate processing chamber while holding the corrected state. Japanese Patent No. 2633516 discloses a method in which a substrate is attracted onto an electrostatic attraction device outside a substrate processing chamber and it is conveyed into the substrate processing chamber. In accordance with this patent document, however, the voltage supply to the electrostatic attraction device is once interrupted during the conveyance. Therefore, the substrate flatness correction is discontinued during the conveyance. Here, the substrate processing chamber may be, for example, an exposure chamber in the case of an exposure apparatus.

Japanese Laid-Open Patent Application, Publication No. 2003-142393, discloses a method in which, by use of a substrate attracting device having a vacuum attracting mechanism and an electrostatic attracting mechanism, a substrate is flatness-corrected by vacuum attraction outside a substrate processing chamber (a load lock chamber, for example), and thereafter, the attraction is changed to electrostatic attraction and the substrate is conveyed into the substrate processing chamber. More specifically, in a load lock chamber, which is separate from the substrate processing chamber, first, only the clearance between the substrate and the substrate attracting device is exhausted and, after the substrate is vacuum attracted, a voltage is applied to a chuck to change the attraction to electrostatic attraction. Thereafter, the clearance between the substrate and the substrate attracting device is opened to the atmosphere to release the vacuum attraction. Subsequently, a vacuum is introduced into the load lock chamber until the inside pressure thereof becomes approximately equal to that of the substrate processing chamber.

Here, the pressure changes through a low discharge generating voltage region of a Paschen's electrical discharge voltage graph, as shown in FIG. 11, that is, through a minimum value (Vs(MIN)) region. Therefore, electrical discharge can easily occur between the substrate and the substrate attracting device to which the voltage is being applied. For example, if the clearance between the substrate and the substrate attracting device is 100 lm, as shown in FIG. 11, the discharge voltage takes a minimum value of 300 V at a pressure of 7 [kPa]. Therefore, if the pressure of the clearance is lowered from the atmospheric pressure (101 [kPa]) to the substrate processing chamber pressure (not greater than 1 [kPa]), the change inevitably passes the minimum value and the electrical discharge quite easily occurs. If an electrical discharge occurs between the substrate and the substrate attracting device, it may cause damage to the substrate or breakage of devices on the substrate. Furthermore, the discharge may create dust particles, which contaminate the substrate and the substrate attracting device. In consideration of this, according to this patent document, a low voltage is applied to the chuck so as to avoid an occurrence of the electrical discharge phenomenon during exhaust of the load lock chamber.

However, if the voltage for electrostatic attraction is made low (not greater than 300 V), a sufficient attraction force is not produced and, therefore, it is unable to achieve secure flatness correction of a warped substrate.

As described above, in the semiconductor manufacturing processes, particularly, in an exposure process, or the like, in which a very fine pattern is processed, even if a substrate, such as a wafer, has a warp, it should be securely corrected so as to be flat. Furthermore, in the case of a manufacturing apparatus that uses a vacuum ambience therein, the fact that conventional vacuum attracting mechanisms are unusable and that electrical discharge easily takes place in the electrostatic attracting mechanism should be taken into account, and yet safe and secure substrate flatness correction must be done to improve the overlay precision and the throughput.

SUMMARY OF THE INVENTION

It is accordingly an object of the present invention to solve at least one of the inconveniences described above.

In accordance with an aspect of the present invention, to achieve this object, there is provided a substrate holding system having a chuck for vacuum attraction and electrostatic attraction of a substrate, the system comprising a ring-like rim for carrying a substrate thereon, a plurality of first protrusions disposed inside the rim, for carrying the substrate thereon, and a plurality of second protrusions disposed inside the rim, for carrying the substrate thereon, wherein a substrate carrying surface area of at least one first protrusion is smaller than a substrate carrying surface area of at least one second protrusion and wherein a smallest interval of the first protrusions is smaller than a smallest interval of the second protrusions.

In accordance with the present invention, flatness correction of a substrate can be stabilized.

These and other objects, features and advantages of the present invention will become more apparent upon consideration of the following description of the preferred embodiments of the present invention taken in conjunction with the accompanying drawings.

BRIEF DESCRIPTION OF THE DRAWINGS

FIGS. 3A and 3B are schematic views of a structure of a substrate attracting device according to a second embodiment of the present invention.

DESCRIPTION OF THE PREFERRED EMBODIMENTS

Preferred embodiments of the present invention will now be described with reference to the attached drawings.

Embodiment 1

Figure 1:
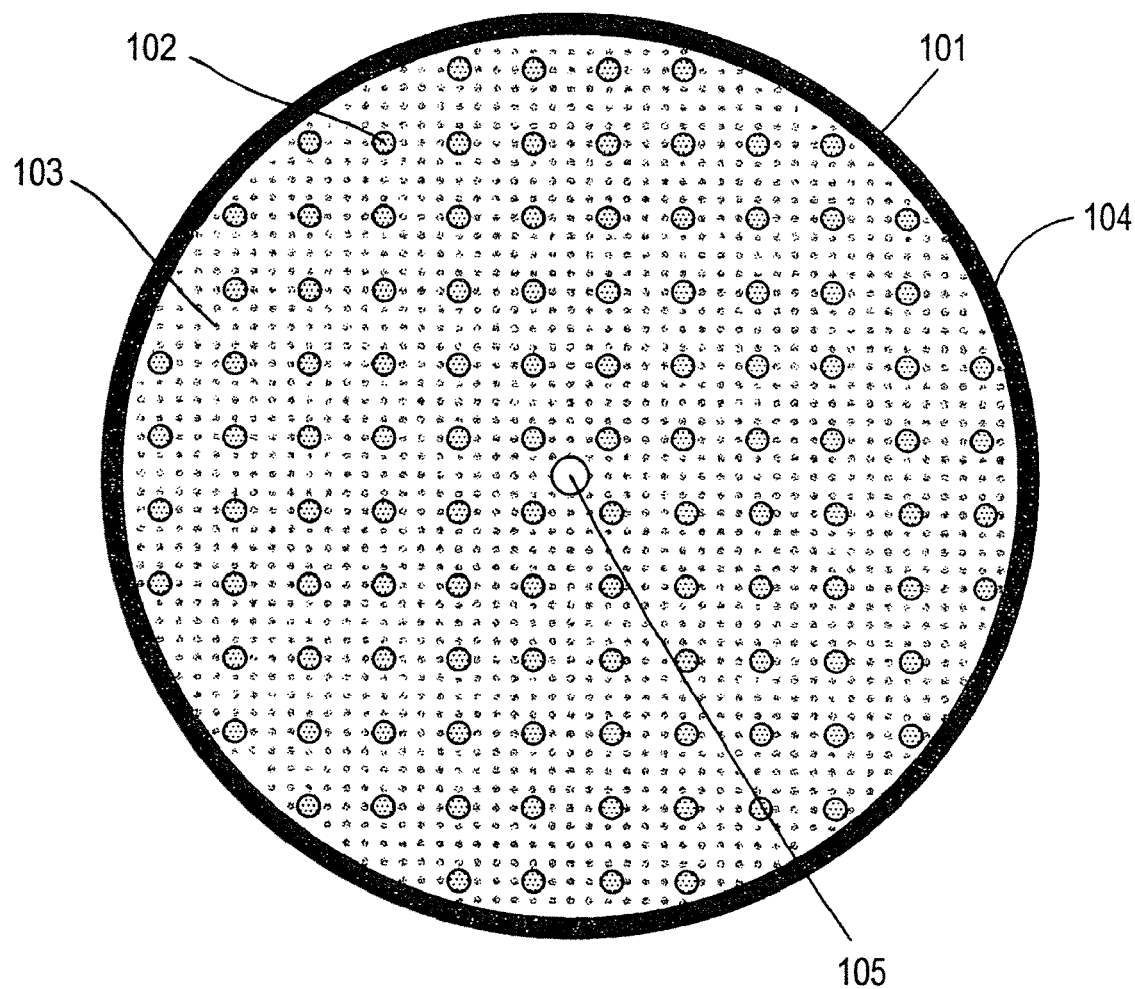
FIG. 1 is a schematic view of a structure of a substrate attracting device according to a first embodiment of the present invention.
Figure 2A:
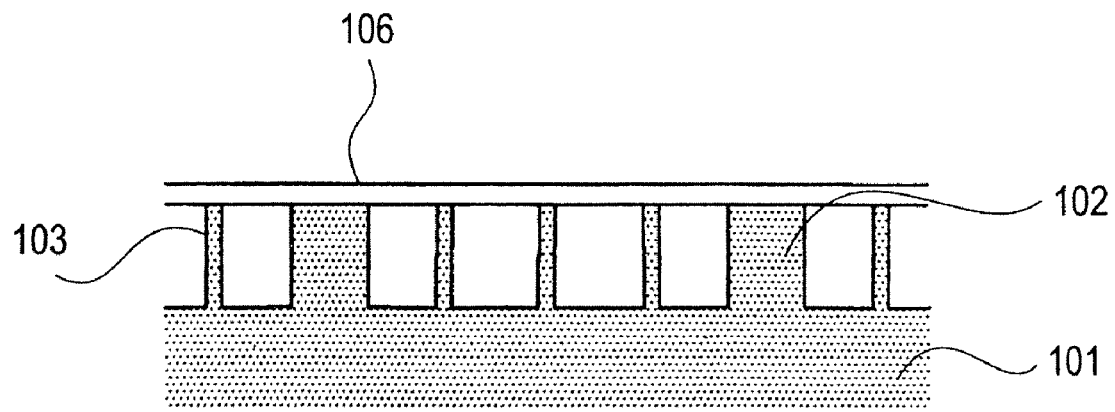
FIGS. 2A and 2B are sectional views of the structure of the FIG. 1 embodiment.
Figure 2B:
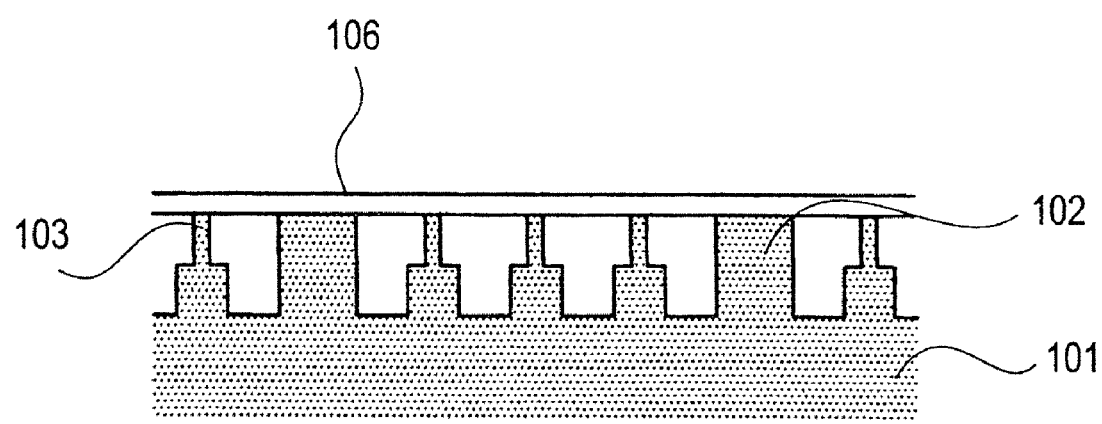

FIGS. 1, 2A and 2B illustrate the structure of a substrate attracting device according to a first embodiment of the present invention. In FIG. 1, a substrate attracting portion (chuck) 101 includes protrusions (first protrusions) 102 mainly for electrostatic attraction, protrusions (second protrusions) 103 mainly for vacuum attraction, a ring-like rim 104 adapted to apply a vacuum between the substrate and the substrate attracting portion, and an exhaust port 105. The total area of the substrate carrying surface as defined by the group of protrusions 103 for the vacuum attraction is made larger than the total area of the substrate carrying surface as defined by the group of protrusions 102 for electrostatic attraction. Furthermore, each protrusion 103 for vacuum attraction has a smaller carrying surface area than the protrusion 102 for electrostatic attraction, and also the interval of the protrusions 103 is smaller than that of the protrusions 102. Each of the protrusions 102 and 103 has a height not lower than 50 [im].

In vacuum attraction, attraction forces act on the region other than the contact surface between a substrate 106 (FIGS. 2A and 2B) and the substrate attracting portion 101 (more exactly, the substrate carrying surfaces of the protrusions 102 and 103, and the rim 104). If, therefore, the interval between the protrusions is wide, the substrate receives a downward force and it is curved downwardly. In this embodiment, since the substrate can be supported at multiple points by means of the protrusions 103 having narrow intervals, deformation of the substrate can be made sufficiently small. Here, for better flatness of the substrate, the substrate carrying surface area of the protrusions 103, as well as the interval of them, should desirably be made as small as possible.

In electrostatic attraction, basically, the substrate is attracted and held by the contact surface between the substrate 106 and the substrate attracting portion 101 (more exactly, the substrate carrying surfaces of the protrusions 102). Therefore, this contact surface should have a certain area. In this embodiment, a sufficient contact surface area is secured by the protrusions 102 as a whole and, by producing an attraction force to the whole substrate surface, the substrate can be well attracted and held. In order to secure a contact surface area to obtain a sufficient electrostatic attraction force, the surface area of the protrusions 102 should be made as large as possible. However, taking into account the risk of substrate flatness degradation due to increased probability of particle bite, it should be designed appropriately.

With the structure described above, in a substrate attracting device having both a vacuum attracting mechanism and an electrostatic attracting mechanism, whichever one is operated or even when both are operated, the substrate can be attracted and held to the substrate attracting device with good flatness.

Particularly, as regards a substrate being warped, first, the vacuum attracting mechanism may be operated to correct the warp and, subsequently, the electrostatic attracting mechanism may be operated. On that occasion, even if the substrate is moved into a vacuum ambience, the flatness of the corrected substrate can be well maintained.

FIGS. 2A and 2B illustrate a section when a substrate 106 is placed on the substrate attracting device of this embodiment. As regards the material of the substrate attracting portion 101, from the standpoint of rigidity or weight, for example, may be used as a base material. From the standpoint of thermal expansion, a low thermal expansion material may preferably be used as a base material.

As regards the method of forming protrusions 102 and 103 upon the base material, a blast processing method may be used, for example. Here, as shown in FIG. 2A, the vacuum attraction protrusion 102 having a smaller sectional area may be formed to a depth of 50 im or more, while keeping a constant section area. If, however, insufficient rigidity is concerned, as shown in FIG. 2B, at some depth, the sectional area may be enlarged for increased rigidity.

Embodiment 2

FIGS. 3A, 3B, 4A and 4B illustrate the structure of a substrate attracting device according to a second embodiment of the present invention. In the second embodiment, a substrate attracting portion (chuck) 201 having at least an electrostatic attracting mechanism is provided with a power supply terminal 202 for during conveyance of the substrate attracting portion, and a power supply terminal 203 for during fixation (stationary) of the substrate attracting portion.

FIGS. 3A and 3B show a power supplying line 206 for the substrate attracting portion 201 when the same is being conveyed by a conveying hand 205. The power supply terminal 202 for during conveyance is provided at a location separate from the power supply terminal 203 for during fixation of the substrate attracting portion, and electrical power is supplied from the power supplying line 206 of the conveying hand 205. The conveying hand 205 may have any arbitrary shape, and also the power supply terminal 202 may be provided at any arbitrary location. However, for convenience of cable setting, it should desirably be provided adjacent to a position where the conveying hand 205 grasps the substrate attracting portion 201.

Figure 4A:
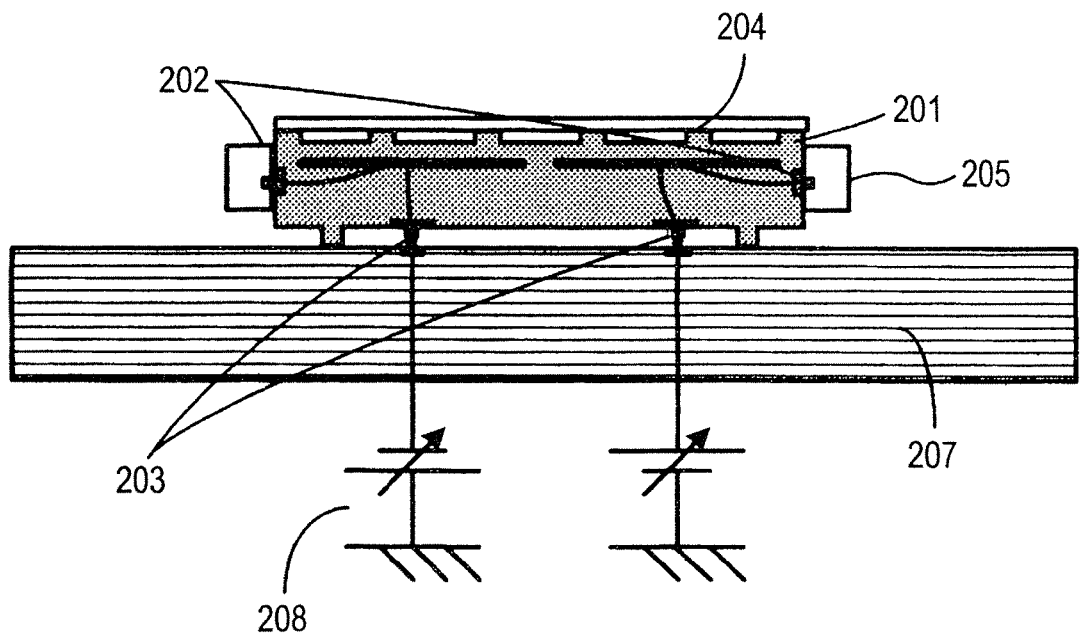
FIGS. 4A and 4B are schematic and sectional views for explaining the operation of a power supplying system for transfer of a substrate between a conveying hand and a fixed plate, in the structure of FIG. 1.
Figure 4B:
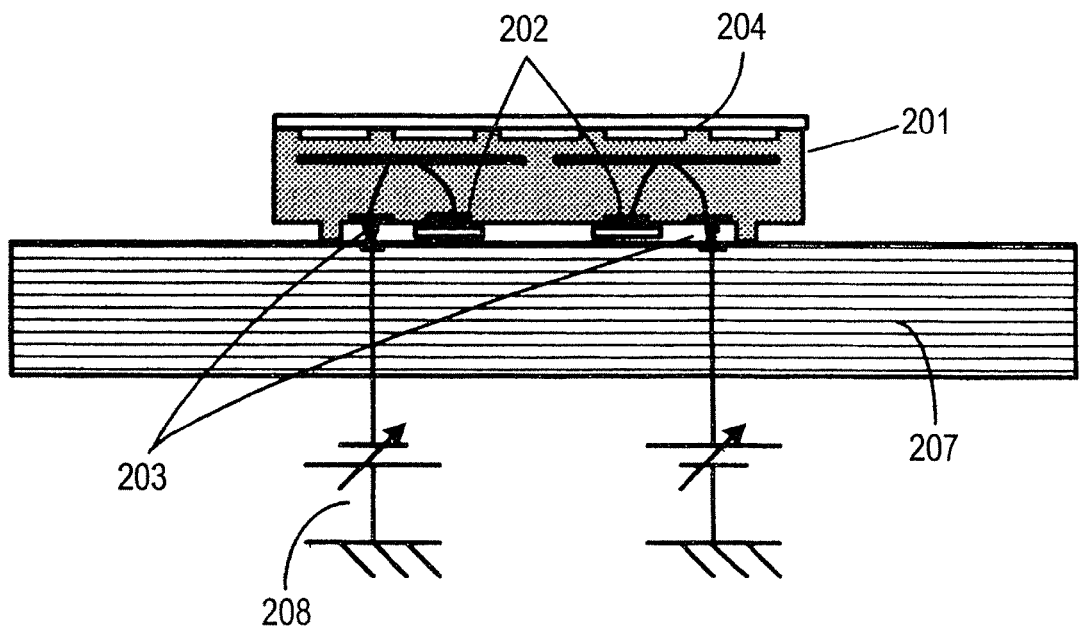

FIGS. 4A and 4B illustrate a power supply line for during transfer of a chuck between the conveying hand 205 and a chuck supporting table 207. In the state illustrated, electrical power can be supplied to the substrate attracting portion 201 from both of a power supplying line 208 from the chuck supporting table 207 and a power supplying line 206 from the conveying hand 205. As regards the chuck supporting table 207, if, in an exposure apparatus, the substrate attracting portion 201 is held fixed within an exposure chamber (substrate processing chamber), it may be a stage. If the substrate attracting portion is held fixed outside the substrate processing chamber, for example, fixed in a load lock chamber, it may be a supporting table provided there. As shown in FIGS. 4A or 4B, the power supplying terminal 203 for during fixation of the substrate attracting portion 201 may be provided at the bottom face of the substrate attracting portion, or it may be provided at any location such as upon a side face of the substrate attracting portion 201, for example.

As described above, in relation to at least one electrode of the substrate attracting portion 201, both a conveyance-period power supplying terminal 201 and a fixation-period power supplying terminal 203 are prepared. With this structure, electrical power can be supplied from respective power supplying lines 206 and 208. As a result, even if the state of substrate attracting portion 201 changes in an order of fixation, conveyance and fixation, for example, the power can be supplied thereto continuously.

As regards the power supplying terminal, for prevention of electrical discharge or for safety, it should desirably be covered by insulation.

In the structure described above, even if the substrate is warped and flatness correction is not easy, it is possible that the flatness correction is done outside a substrate processing chamber, for example, in a load lock chamber in which a relatively wide freedom is available in terms of space and environment, and, subsequently, the substrate is conveyed into the substrate processing chamber while keeping the corrected flatness. Therefore, an increase of yield resulting from secured flatness correction and an increase of throughput resulting from omission of a substrate attracting step inside the substrate processing chamber, as well, can be achieved.

For better results, three protrusions may desirably be formed on the bottom face of the substrate holding portion 201 to provide a three-point support structure. On that occasion, the same supporting state can be maintained continuously even if the fixing position of the substrate attracting portion is shifted, and, therefore, a better reproducibility of the substrate attracting state and improved overlay precision are assured.

Embodiment 3

Figure 5:
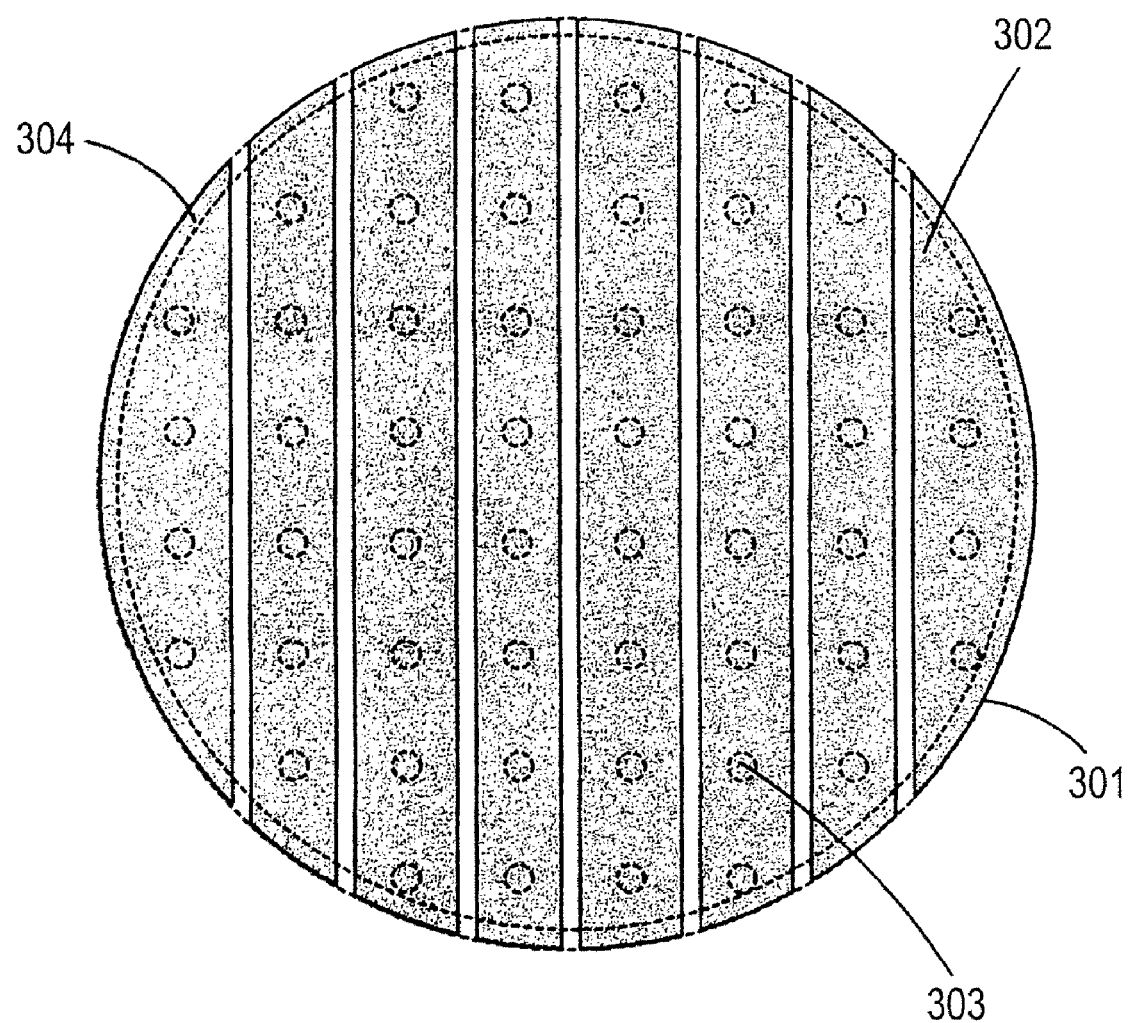
FIG. 5 is a schematic view of a structure of a substrate attracting device in a substrate correcting device according to a third embodiment of the present invention.
Figure 6:
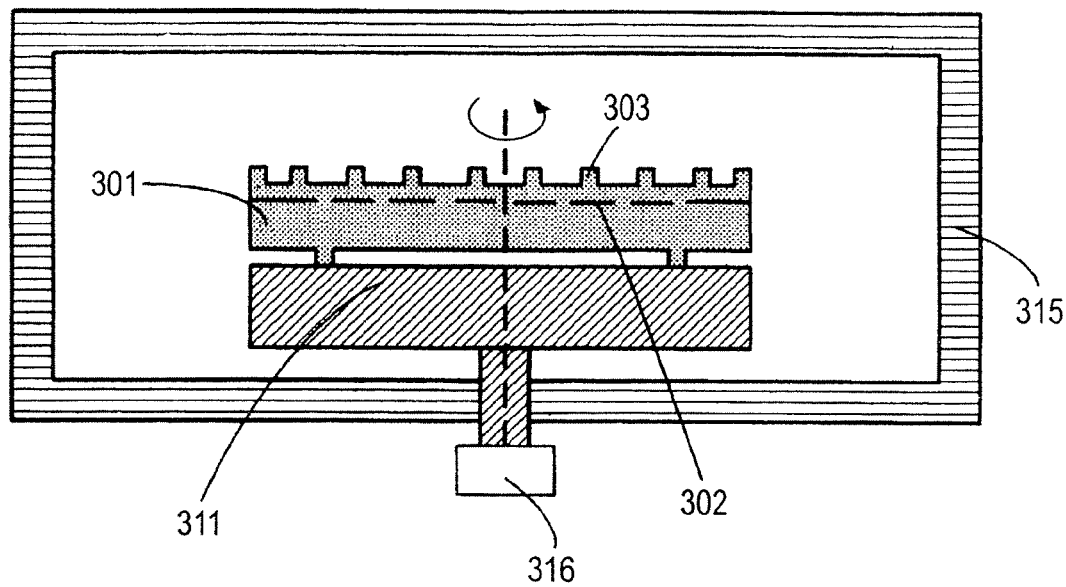
FIG. 6 is a schematic and sectional view of the structure of the substrate correcting device of the third embodiment of the present invention.

FIGS. 5 and 6 illustrate the structure of a substrate correcting device according to a third embodiment of the present invention. In the third embodiment, a substrate attracting portion (chuck) 301, having at least an electrostatic attracting mechanism, is provided with electrodes 302, which are arrayed in a stripe-like fashion, as shown in FIG. 5, and also, means for applying a voltage to each electrode is provided. Although, in FIG. 5, the shape of other substrate carrying surfaces is defined by protrusions 303 and a ring-like rim 304, any other structure may be used. However, for a secured attraction force, it is preferable to provide electrodes throughout the whole carrying surface as much as possible.

In this embodiment, as shown in FIG. 6, there is a chuck rotating mechanism 36 for rotationally moving the chuck 301 to thereby change the orientation of the stripe-like electrodes 302 as desired. In FIG. 6, the rotating mechanism 316 is connected to the chuck supporting table 311 and placed inside a chamber 315, which may be a substrate processing chamber or a load lock chamber. However, the rotating mechanisms may have any other structure, and it may be provided inside the substrate attracting portion 301.

In the structure described above, when a voltage is applied sequentially to the electrodes, from one at an end in FIG. 5, for example, a warped substrate can be consecutively attracted to the substrate attracting portion from its end portion, by which the substrate can be corrected to be flat. Furthermore, by rotating the substrate attracting portion, it can meet correction of irregularly warped substrates. The orientation of the substrate attracting portion may be determined by measuring the warp shape of a substrate beforehand. Alternatively, once a substrate is attracted and, if flatness correction is not good, the orientation is changed by rotation until good flatness correction is enabled.

Embodiment 4

Figure 7:
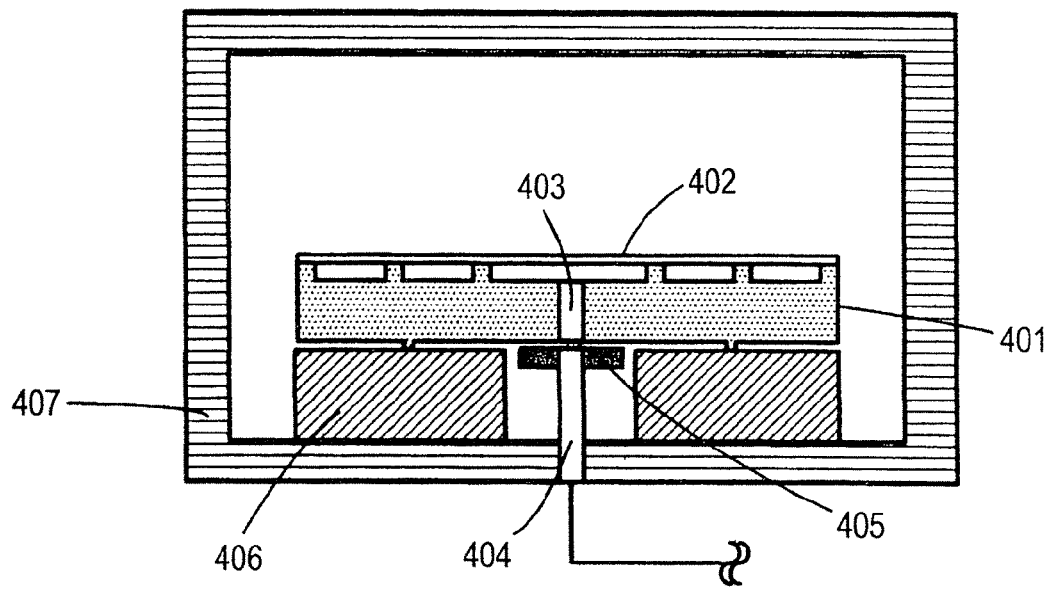
FIG. 7 is a schematic and sectional view for explaining a vacuum attraction piping structure in the substrate attracting device of the third embodiment of the present invention.

FIG. 7 illustrates a vacuum attraction piping (exhausting labyrinth) structure of a substrate attracting device according to a fourth embodiment of the present invention. In the structure of FIG. 7, in a substrate attracting portion (chuck) 401 having at least a vacuum attracting mechanism, a vacuum exhaust pipe 404 is disposed opposed to an exhaust portion 403 for vacuum attraction, inside the substrate attracting portion, with a small clearance intervening therebetween. Also, there is a partition wall 405, which functions to prevent a gas, outside a closed space defined by the substrate attracting portion and the substrate, from flowing into the exhaust port 403 and into that closed space through the small clearance.

The width of the small clearance is set to an extent (about 5 [im]), for example) making the conductance of the clearance sufficiently small to prevent inflow of the gas.

Figure 8:
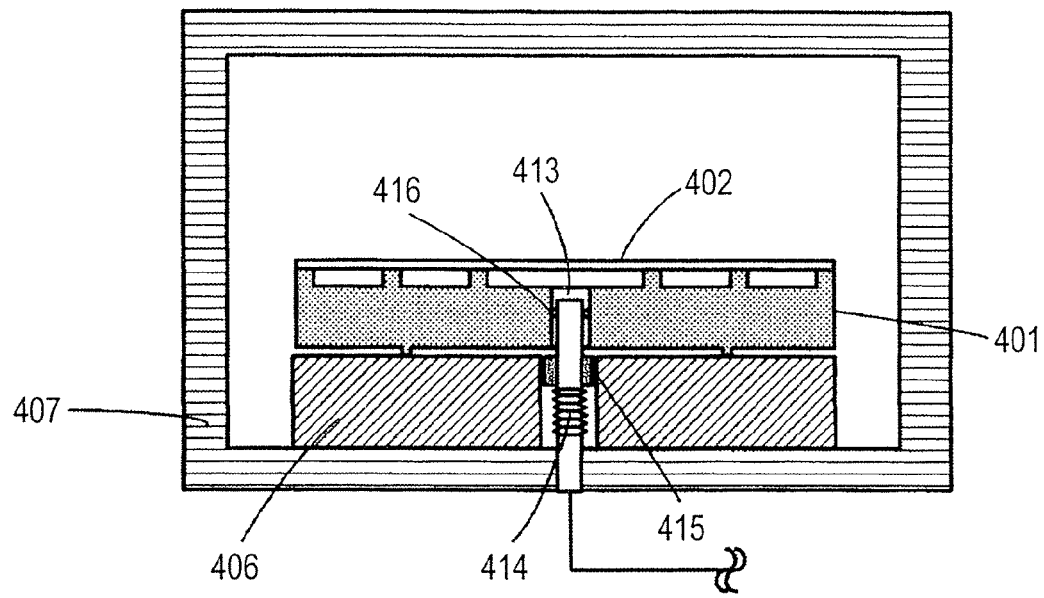
FIG. 8 illustrates a conventional vacuum attraction piping structure.

Conventionally, for vacuum attraction, a seal member, such as an O-ring, is pressed against the bottom face of a substrate attracting portion or, alternatively, as shown in FIG. 8, an exhaust pipe 414 is directly attached to an exhaust port 413 of the substrate attracting portion 401 while using a seal member, such as an O-ring 416. In FIG. 8, denoted at 415 is a pipe connecting mechanism. In these structures, however, since a force can be applied to the substrate attracting portion 401 from the exhaust pipe 414 through the seal member, small distortion may be created in the substrate attracting portion 401. Furthermore, the distortion to be produced in the substrate attracting portion 401 is variable in dependence upon the connection state with seal member 416. Therefore, the flatness correction state of the substrate 402 cannot be reproduced.

In this embodiment, in consideration of it, as shown in FIG. 7, a non-contact vacuum seal structure is provided between the exhaust pipe 404 and the vacuum attracting portion 401, thereby to prevent transmission of a force from the exhaust pipe 404 to the vacuum attracting portion 404. With this arrangement, substrate flatness correction of good reproducibility is achieved.

In the case of a system wherein a substrate attracting portion is made conveyable, simply by placing the substrate attracting portion 401 on the chuck supporting table 406, a vacuum seal is enabled. On such an occasion, therefore, a mechanism or a step for every time connecting a vacuum pipe to the substrate attracting portion can conveniently be omitted. Furthermore, since no heat is transferred to the substrate attracting portion from the load lock chamber, or the like, through the vacuum pipe, the structure for preventing thermal deformation of the substrate attracting portion can be omitted or simplified.

These advantageous features function particularly effectively in the structure that the substrate attracting portion 401 is supported on the chuck supporting table 406 by three-point support. When the substrate attracting portion 401 is supported at three points, although there may occur self-weight deformation in the substrate attracting portion and the flatness of the substrate carrying surface may be degraded, the flatness of the substrate carrying surface can be improved by flattening the same while leaving the self-weight deformation as it is. If it is difficult to perform the flattening while keeping the self-weight deformed condition, depending on the process condition, or the like, an appropriate external force may be applied to cause deformation, equivalent to self-weight deformation, in the substrate attracting portion and then the flattening process may be carried out.

Furthermore, if the vacuum seal effect of the non-contact partition wall 405 should be improved much more, a groove surrounding the exhaust pipe 104 may be formed in the partition wall, as disclosed in Japanese Patent No. 2587227, and the groove may be exhausted by means of a vacuum pump, or the like. By this, the vacuum seal effect can be enhanced.

Embodiment 5

Figure 9:
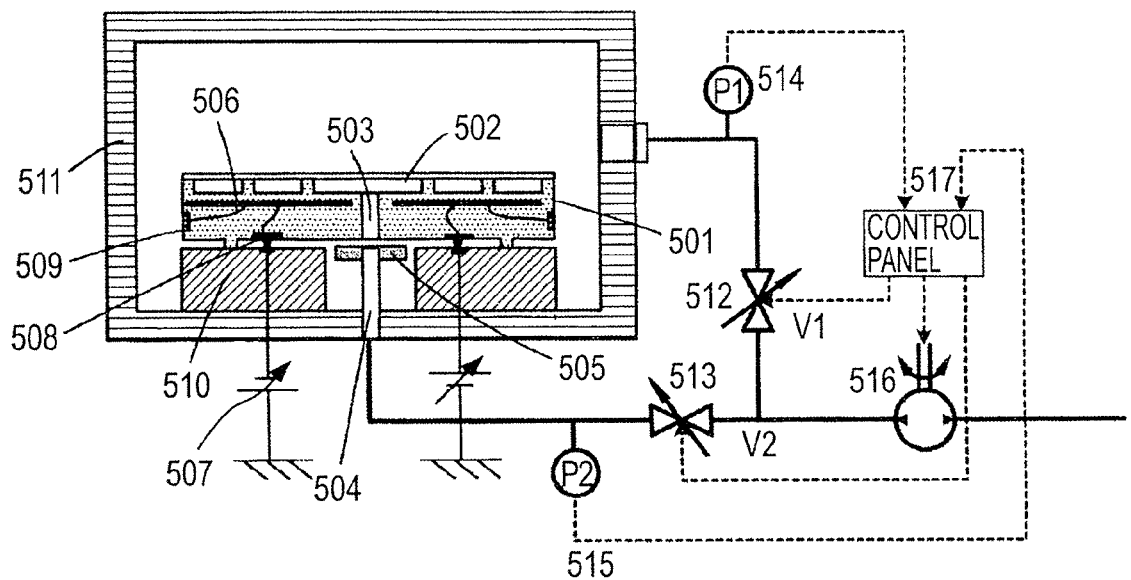
FIG. 9 is a schematic and diagrammatic view of a structure of a substrate correcting device in a load lock chamber, according to a fourth embodiment of the present invention.

FIG. 9 illustrates a general structure of a substrate correcting device according to a fifth embodiment of the present invention. The substrate correcting device of FIG. 5 mainly comprises a substrate attracting portion (chuck) 501 having an electrostatic attracting mechanism and a vacuum attracting mechanism, a power supply line 507 for operating the electrostatic attracting mechanism, an exhaust port 503 provided in the substrate attracting portion 501, for operating the vacuum attracting mechanism, a vacuum pump 516 for exhausting a clearance between a substrate 502 and the substrate attracting portion 501 and exhausting the load lock chamber 511, a valve 512 of a pipe extending from the vacuum pump 516 to the load lock chamber 511, a valve 513 of a pipe connected to the exhaust port 503, pressure gauges 514 and 515 for measuring the pressure of the clearance between the substrate and the substrate attracting portion and the pressure of the load lock chamber 511, respectively, and a controller 517 for controlling the valves 512 and 513, as well as the vacuum pump 516.

Figure 10:
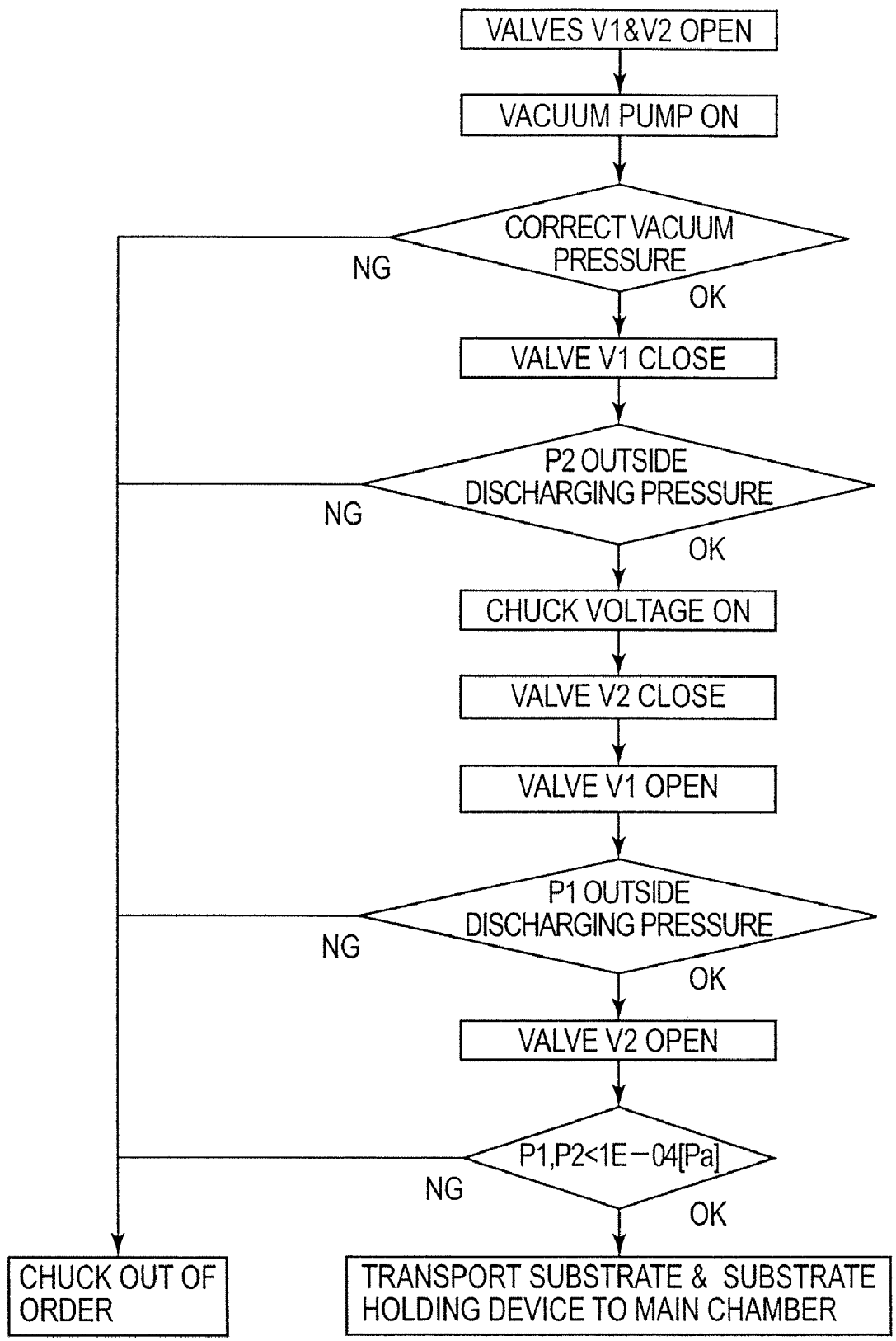
FIG. 10 is a flow chart for explaining the substrate correcting operation in the structure of FIG. 9.
Figure 11:
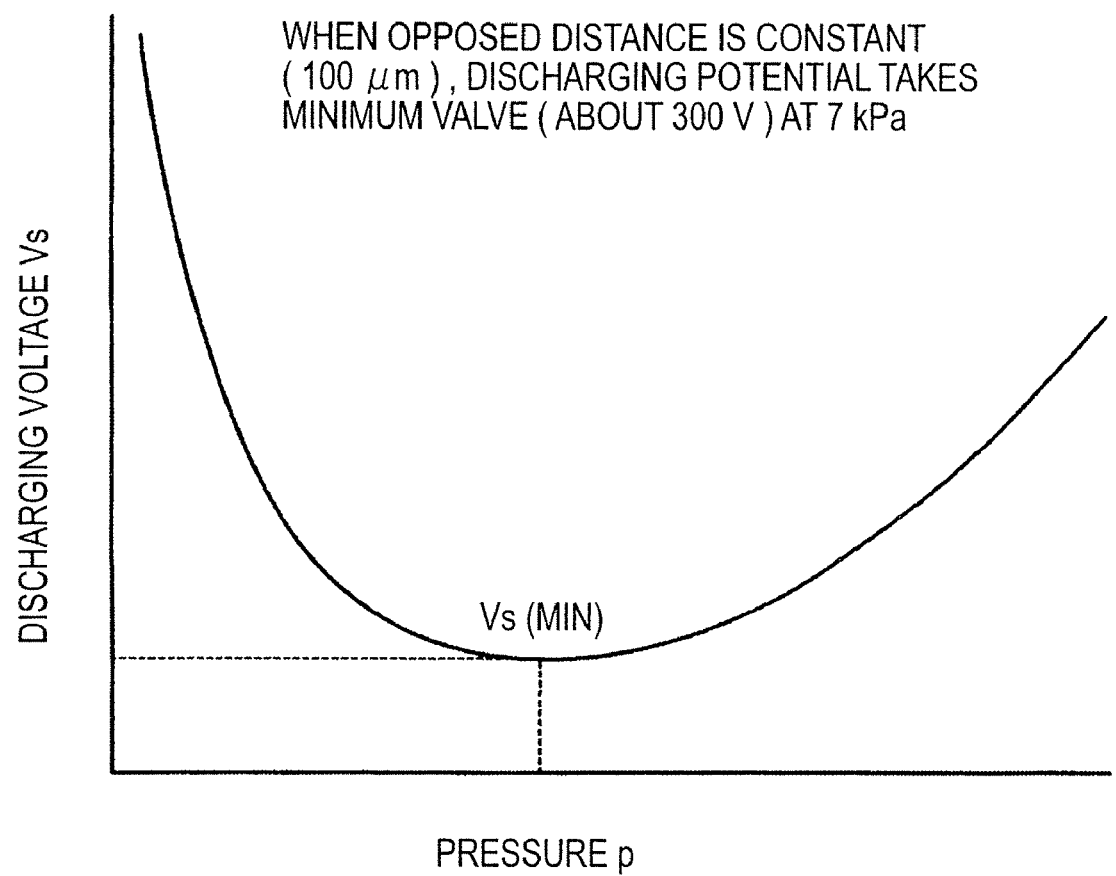
FIG. 11 is a graph of the theory of Paschen's electrical discharge potential.

FIG. 10 is a flow chart, illustrating the operation of the structure described above. Initially, a substrate 502 is conveyed onto the substrate attracting portion 501 is conveyed onto the substrate attracting portion 501 inside the load lock chamber 511. Then, the valves 512 and 513 are opened and the vacuum pump 516 is actuated, to reduce the pressure inside the load lock chamber 511 and the pressure in the clearance between the substrate 502 and the substrate attracting portion 501 to an appropriate pressure, respectively, simultaneously. The pressure, here, corresponds to a differential pressure necessary for vacuum attracting the substrate 502. If, for example, the appropriate differential pressure for vacuum attraction of a substrate 502 in a certain substrate attracting portion 502 is 30 [kPa], the pressure in the whole is reduced to 30 [kPa]. Subsequently, the load lock chamber valve 512 is closed, and only the clearance between the substrate 502 and the substrate attracting portion 501 is vacuum exhausted, whereby the substrate 502 is vacuum attracted. After it is discriminated that the pressure of the clearance between the substrate 502 and the substrate attracting portion 501 has passed the minimum value of Paschen's discharge potential graph (FIG. 11) and it has reached a pressure level (e.g., 100 Pa) whereat the electrical discharge does not easily occur (i.e., the discharge potential is sufficiently high), the electrostatic attracting mechanism is actuated by the power supplying line 507, whereby the substrate 502 is electrostatically attracted onto the substrate attracting portion 501.

Thereafter, the valve 513 is closed to prevent back flow of air into the clearance between the substrate 502 and the substrate attracting portion 501 and, then, the valve 512 is opened to vacuum-exhaust the load lock chamber 511. Here, if the pressure of the clearance between the substrate 502 and the substrate attracting portion 501 cannot be maintained constant due to gas leakage, or the like, an exclusive vacuum pump may be preferably provided separately to keep that pressure constant. After it is discriminated that the pressure of the load lock chamber 511 has passed the minimum value of Paschen's discharge potential graph (FIG. 11) and it has reached a pressure level whereat the electrical discharge does not easily occur (i.e., the discharge potential is sufficiently high), the valve 513 is opened and a vacuum is applied until the pressure as a whole becomes approximately equal to that of the substrate processing chamber (not greater than 1 Pa). Through these sequential operations, even if a high voltage enabling the flatness correction is applied to the chuck, there is no possibility of electrical discharge between the substrate 502 and the substrate attracting portion 501.

Thereafter, the substrate 502 and the substrate attracting portion 501 are conveyed into the substrate processing chamber (not shown), and processing operations for the substrate 501 are initiated. Here, the structure having been described with reference to the second embodiment may be applied, and two or more power supplying systems, such as the fixation-period power supplying terminal 502 and the conveyance-period power supplying terminal 509, may be used. With this arrangement, the substrate 502 can be conveyed into the substrate processing chamber while the flatness corrected state is kept secured.

Alternatively, the structure of the substrate carrying surface of the substrate attracting device having been described with reference to the first embodiment may be applied and, by using either one of the vacuum attraction force and the electrostatic attraction force or by using both of them, the substrate can be held in a flatness well-corrected state.

Furthermore, the structure described with reference to the fourth embodiment may be applied, and a partition wall 505 may be provided inside the load lock chamber and a vacuum exhaust pipe 504 may be connected to the exhaust port 504 without contact thereto. In such a structure, the mechanism or steps for connecting a vacuum pipe to the substrate attracting portion every time it is conveyed thereto, can be omitted. Since there is no effect of insulating thermal external disturbance to the substrate attracting portion or no restriction due to the piping, the condition of confinement to the substrate attracting portion inside the load lock chamber and inside the substrate processing chamber can be made equivalent to each other. Therefore, a flatness corrected state having a good reproducibility is achieved. This structure is particularly effective when the substrate attracting portion 501 is supported on the chuck supporting table at three points. With this arrangement, the substrate attracting portion can hold the same three-point supported state continuously. Therefore, the substrate attracting state has good reproducibility, and thus, the overlay precision, and the like, is improved significantly.

In accordance with the attraction and conveyance sequence for a substrate and a substrate attracting device such as described hereinbefore, the substrate can be flatness corrected with good reproducibility, while avoiding damage to the substrate or a substrate attracting device due to electrical discharge. Additionally, the substrate can be conveyed into the substrate processing chamber while the flatness corrected state is maintained securely.

In accordance with the structures of the embodiments described hereinbefore, a substrate can be securely flatness-corrected, and it can be conveyed into a substrate processing chamber while avoiding damage to the substrate or substrate attracting device due to electrical discharge and while maintaining the corrected flatness. Therefore, in a device manufacturing apparatus using such an exposure apparatus having a substrate attracting device or a chuck and holding device, the throughput and the substrate positioning precision, as well as the overly precision, in the exposure apparatus are improved.

Embodiment 6

Next, referring to FIGS. 12 and 13, an embodiment of a device manufacturing method, which uses an exposure apparatus having a substrate attracting device such as described above, will be explained.

Figure 12:
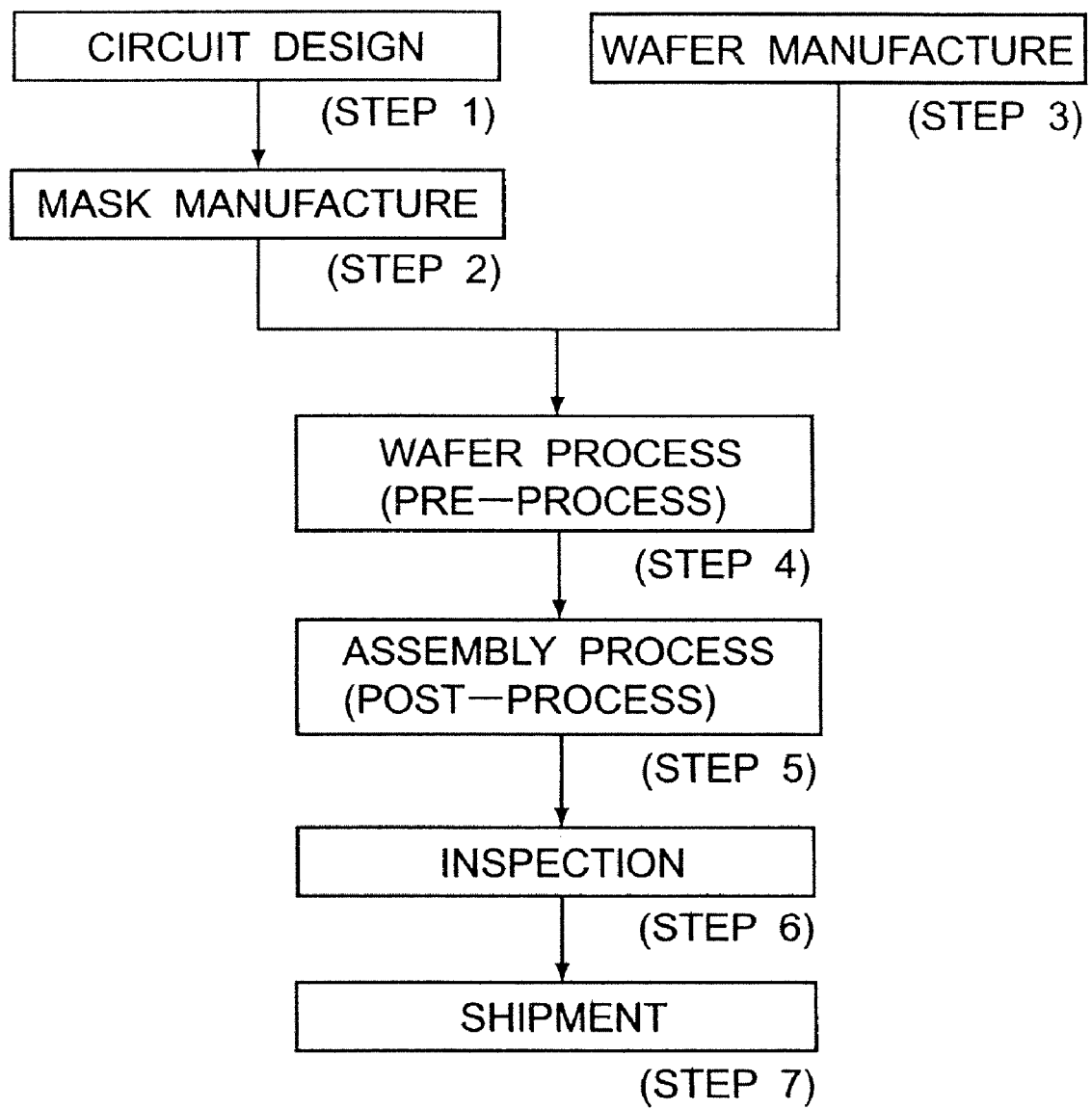
FIG. 12 is a flow chart for explaining the sequence of device manufacturing processes.

FIG. 12 is a flow chart for explaining the procedure of manufacturing various microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 13:
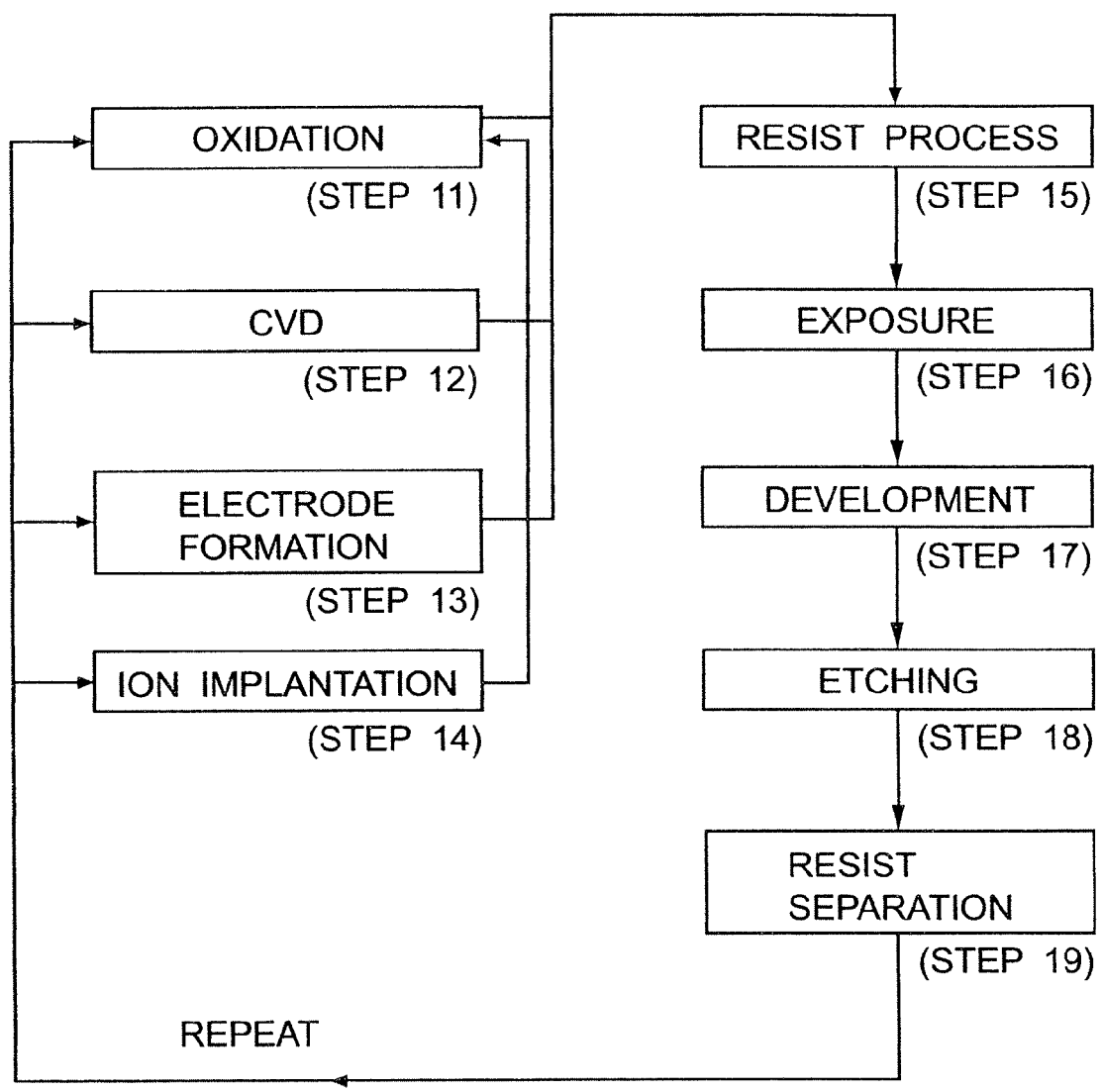
FIG. 13 is a flow chart for explaining details of a wafer process included in the procedure of FIG. 12.

FIG. 13 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured in a reduced cost.

Embodiment 7

Figure 14:
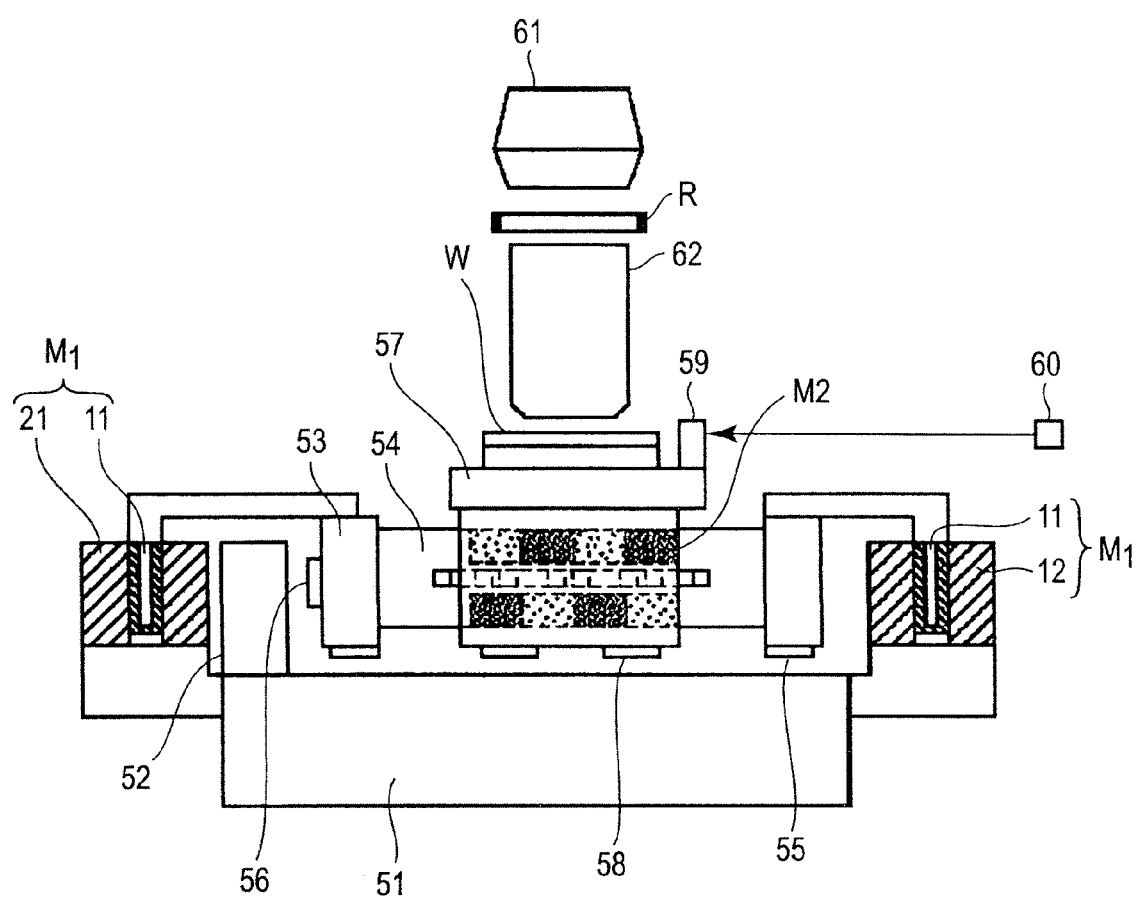
FIG. 14 is a schematic view of a device manufacturing exposure apparatus.

FIG. 14 shows an exposure apparatus for device manufacture, having a substrate attracting device as described hereinbefore.

This exposure apparatus is to be used for the manufacture of microdevices having a fine pattern formed thereon, such as semiconductor devices (semiconductor integrated circuits, for example), micromachines, or thin-film magnetic heads, for example. In this exposure apparatus, exposure light (which may include visible light, ultraviolet light, EUV light, X-rays, electron beams, and charge particle beams, for example), as exposure energy supplied from a light source 61, illuminates a reticle R (original), and light from the reticle is projected onto a semiconductor wafer W (substrate) through a projection system having a projection lens 62 (which may include a refractive lens, a reflective lens, a catadioptric lens system, and a charged particle lens, for example), whereby a desired pattern is produced on the substrate.

The exposure apparatus includes a base table 51 having a guide 52 and a linear motor stator 21 fixed thereto. The linear motor stator 21 has a multiple-phase electromagnetic coil, while a linear motor movable element 11 includes a permanent magnet group. The linear motor movable portion 11 is connected as a movable portion 53 to a movable guide 54 (stage), and through the drive of the linear motor M1, the movable guide 54 can be moved in a direction of a normal to the sheet of the drawing. The movable portion 53 is supported by a static bearing 55, taking the upper surface of the base table 51 as a reference, and also by a static bearing 56, taking the side surface of the guide 52 as a reference.

A movable stage 57, which is a stage member disposed to straddle the movable guide 54, is supported by a static bearing 58. This movable stage 57 is driven by a similar linear motor M2, so that the movable stage 57 leftwardly and rightwardly as viewed in the drawing, while taking the movable guide 54 as a reference. The motion of the movable stage 57 is measured by means of an interferometer 60 and a mirror 59, which is fixed to the movable stage 59.

A wafer (substrate) W is held on a chuck, which is mounted on the movable stage 57, and a pattern of the reticle R is transferred in a reduced scale onto different regions on the wafer W by means of the light source 61 and the projection optical system 62, in accordance with a step-and-repeat method or a step-and-scan method.

It should be noted that the substrate attracting device described hereinbefore can be similarly applied also to an exposure apparatus in which, without using a mask, a circuit pattern is directly drawn on a semiconductor wafer to expose a resist thereon.

The present invention can be embodied in various aspects, and examples are as follows.

(1) A substrate attracting device having a substrate attracting portion, including a vacuum attracting mechanism and an electrostatic attracting mechanism, characterized in that the substrate attracting portion has a substrate carrying surface defined by at least a ring-like rim and first and second protrusions groups, each protrusion of the first protrusion group having a carrying surface area and a minimum protrusion interval larger than those of each protrusion of the second protrusion group.

(2) A substrate attracting device according to Item (1), wherein a total area of the substrate carrying surface defined by the first protrusion group is larger than a total area of the substrate carrying surface defined by the second protrusion group.

(3) A substrate attracting device according to Item (1) or Item (2), wherein the first protrusion group is mainly for electrostatic attraction, while the second protrusion group is mainly for vacuum attraction.

(4) A substrate attracting device according to any one of Items (1)-(3), wherein the first protrusion group is protrusions mainly for attracting and holding the substrate during electrostatic attraction, and the second protrusion group is protrusions mainly for suppressing flexure of the substrate during vacuum attraction.

(5) A substrate attracting device according to any one of Items (1)-(4), wherein each of the first and second protrusion groups has a height not lower than 50 im.

(6) A substrate attracting device having a substrate attracting portion, including an electrostatic attracting mechanism, characterized by an electrode for electrostatic attraction and having two or more power supplying terminals at the substrate attracting portion.

(7) A substrate attracting device according to Item (6), wherein, to the two or more power supplying terminals, electrical power is supplied from separate power supplying systems.

(8) A substrate attracting device according to Item (6) or Item (7), wherein the two power supplying terminals are for during movement of the substrate attracting portion and for during stationary fixation of the substrate attracting portion, respectively.

(9) A substrate attracting device according to any one of Items (6)-(8), wherein the two power supplying terminals are a power supplying terminal to which electrical power is supplied from a conveying system for conveying the substrate attracting portion, and a power supplying terminal to which electrical power is supplied from a chamber or a stage.

(10) A substrate attracting device according to any one of Items (6)-(9), wherein, when a substrate is placed on the substrate attracting portion, the electrostatic attracting mechanism is continuously energized through the two or more power supplying terminals.

(11) A substrate attracting device having an electrostatic attracting mechanism, characterized by a substrate attracting portion having a plurality of electrostatic attraction electrodes disposed in a stripe-like fashion, means for applying a voltage to the plurality of electrodes independently of each other, and a mechanism for relatively rotating the substrate attracting portion relative to a substrate to be attracted by the substrate attracting portion.

(12) A substrate attracting device according to Item (11), wherein the substrate attracting portion is rotated in a direction effective to correct the flatness of the substrate.

(13) A substrate attracting device according to Item (11) or Item (12), wherein the substrate attracting portion is rotated in a horizontal direction.

(14) A substrate attracting device according to any one of Items (11)-(13), wherein the substrate attracting portion is rotated outside a substrate processing chamber where a predetermined process is to be performed to the substrate attracted to the substrate attracting portion.

(15) A substrate attracting device, characterized by a substrate attracting portion having a vacuum attracting mechanism, a vacuum exhaust pipe disposed opposed to a vacuum exhaust port formed in the substrate attracting portion, with a small clearance intervening therebetween, and a partition wall effective to prevent inflow of a gas outside the substrate attracting portion through the small clearance.

(16) A substrate attracting device according to Item (15), wherein the partition wall is disposed at a position out of contact to the substrate attracting portion, and wherein there is an exhaust mechanism for exhausting a space between the substrate attracting portion and the partition wall.

(17) A substrate attracting device according to Item (15) or Item (16), wherein the substrate attracting portion is made conveyable.

(18) A substrate attracting device according to any one of Items (15)-(17), wherein the vacuum exhaust pipe and the partition wall are provided outside a substrate processing chamber in which a predetermined process is to be carried out to the substrate attracted to the substrate attracting portion.

(19) A substrate attracting device having a substrate attracting portion, including an electrostatic attracting mechanism, characterized by control means operable so that, when the substrate is attracted to the substrate attracting portion, a peripheral portion of the substrate and a clearance between the substrate and the substrate attracting portion are depressurized and, thereafter, only the clearance between the substrate and the substrate attracting portion is further depressurized, and, subsequently, the electrostatic attracting mechanism is actuated.

(20) A substrate attracting device according to Item (19), wherein the substrate attracting portion includes a vacuum attracting mechanism, and wherein the control means includes an exhaust system in which a vacuum applying pipe for the periphery of the substrate and a vacuum attracting pipe of the vacuum attracting mechanism are communicated with each other.

(21) A substrate attracting device according to Item (19) or Item (20), wherein the control means includes a measuring device for measuring pressures in the periphery of the substrate and in the clearance between the substrate and the substrate attracting portion.

(22) A substrate attracting device according to any one of Items (1)-(21), wherein there is a base member for supporting the substrate attracting portion at three points.

(23) A substrate attracting device according to Item (22), wherein the substrate attracting portion, as supported by the base member at three points, has been flattened in a state of deformation defined while being supported by the three points.

(24) A chuck for holding a substrate through vacuum attraction and electrostatic attraction, characterized by a plurality of first protrusions for electrostatic attraction of the substrate, and a plurality of second protrusions provided between the first protrusions, for supporting the substrate.

(25) A chuck according to Item (24), further characterized by a terminal for receiving electrical power during conveyance.

(26) A holding device for holding a chuck as noted in Item (24) or Item (25), characterized by including exhausting means for vacuum attracting the substrate on the chuck, and power supplying means for electrostatically attracting the substrate on the chuck.

(27) A holding device according to Item (26), wherein the exhausting means exhausts the clearance between the chuck and the substrate without contact to the chuck.

(28) A holding device according to Item (27), wherein the power supplying means supplies electrical power on the basis of the pressure in the clearance.

(29) An exposure apparatus characterized by including a substrate attracting device as noted in any one of Items (1)-(23) or a holding device as noted in any one of Items (26)-(28).

(30) A device manufacturing method, characterized by producing a device by use of an exposure apparatus as noted in Item (29).

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-343676 filed Oct. 1, 2003, which is hereby incorporated by reference herein.

What is claimed is:

1. A substrate holding system comprising:
a substrate attracting device including a vacuum-attracting mechanism and an electrostatic-attracting mechanism,
wherein said substrate attracting device has a substrate supporting surface formed with a ring-like rim and first and second protrusion groups,
wherein a substrate supporting surface area of each protrusion of said first protrusion group is larger than a substrate supporting surface area of each protrusion of said second protrusion group, and
wherein a protrusion interval of said first protrusion group is larger than a protrusion interval of said second protrusion group.

2. A substrate holding system according to claim 1, wherein a total area of the substrate supporting surfaces of the first protrusion group is smaller than a total area of the substrate supporting surfaces of the second protrusion group.

3. A substrate holding system according to claim 1, wherein said first protrusion group mainly functions for electrostatic attraction, while said second protrusion group mainly functions for vacuum attraction.

4. A substrate holding system according to claim 1, wherein said first protrusion group comprises protrusions configured to attract and to hold the substrate mainly during electrostatic attraction, and wherein said second protrusion group comprises protrusions configured to attract and to hold the substrate mainly during vacuum attraction.

5. A substrate holding system according to claim 1, wherein said first and second protrusion groups have a height not less than fifty μm.

6. An exposure apparatus comprising:
a substrate holding system configured to hold a substrate to be exposed; and
an exposure device for exposing the substrate,
wherein said substrate holding system has a substrate attracting device including a vacuum-attracting mechanism and an electrostatic-attracting mechanism,
wherein said substrate attracting device has a substrate supporting surface formed with a ring-like rim and first and second protrusion groups,
wherein a substrate supporting surface area of each protrusion of said first protrusion group is larger than a substrate supporting surface area of each protrusion of said second protrusion group, and
wherein a protrusion interval of said first protrusion group is larger than a protrusion interval of said second protrusion group.

7. A device manufacturing method comprising the steps of:
holding a substrate by use of a substrate holding system of an exposure apparatus;
exposing the substrate by use of the exposure apparatus, while the substrate is being held by the substrate holding system; and
developing the exposed substrate,
wherein the substrate holding system has a substrate attracting device including a vacuum-attracting mechanism and an electrostatic-attracting mechanism,
wherein the substrate attracting device has a substrate supporting surface formed with a ring-like rim and first and second protrusion groups,
wherein a substrate supporting surface area of each protrusion of the first protrusion group is larger than a substrate supporting surface area of each protrusion of the second protrusion group, and
wherein a protrusion interval of the first protrusion group is larger than a protrusion interval of the second protrusion group.

* * * * *